United States Patent
Cheng et al.

(10) Patent No.: US 7,608,506 B2
(45) Date of Patent: Oct. 27, 2009

(54) BODY-CONTACTED SEMICONDUCTOR STRUCTURES AND METHODS OF FABRICATING SUCH BODY-CONTACTED SEMICONDUCTOR STRUCTURES

(75) Inventors: Kangguo Cheng, Guilderland, NY (US); Louis Lu-Chen Hsu, Fishkill, NY (US); Jack Allan Mandelman, Flat Rock, NC (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/925,352

(22) Filed: Oct. 26, 2007

(65) Prior Publication Data

US 2008/0044959 A1 Feb. 21, 2008

Related U.S. Application Data (62) Division of application No. 11/216,386, filed on Aug. 31, 2005.

(51) Int. Cl.
*H01L 21/4763* (2006.01)

(52) U.S. Cl. .................. 438/257; 438/258; 438/279; 438/412; 438/479; 257/E21.339; 257/E21.346; 257/E21.563; 257/E21.564; 257/E21.651; 257/E27.075; 257/E27.084; 257/E27.092; 257/E27.096; 257/E29.346

(58) Field of Classification Search ......... 438/257–279, 438/412, 479, 296; 257/E21.396, 703, E27.112, 257/E29.346, E21.339, 346, 545, 563, 564, 257/651, E27.075, 84, 92, 96, 112
See application file for complete search history.

(56) References Cited

U.S. PATENT DOCUMENTS

| | | | | |
|---|---|---|---|---|
| 4,630,237 | A | * 12/1986 | Miura et al. | ................. 365/104 |
| 4,704,368 | A | * 11/1987 | Goth et al. | ................... 438/329 |
| 5,477,071 | A | * 12/1995 | Hamamoto et al. | ......... 257/302 |
| 5,606,188 | A | 2/1997 | Bronner et al. | |
| 5,795,813 | A | 8/1998 | Hughes et al. | |
| 6,071,791 | A | 6/2000 | Hughes et al. | |
| 6,156,607 | A | 12/2000 | Noble et al. | |
| 6,333,532 | B1 * | 12/2001 | Davari et al. | ................. 257/301 |
| 6,426,252 | B1 | 7/2002 | Radens et al. | |
| 6,437,388 | B1 | 8/2002 | Radens et al. | |

(Continued)

OTHER PUBLICATIONS

Office Action issued in related U.S. Appl. No. 11/216,386; dated as mailed on Mar. 26, 2007; 17 pages; USPTO.

(Continued)

*Primary Examiner*—Michael S Lebentritt
(74) *Attorney, Agent, or Firm*—Wood, Herron & Evans, LLP (57) ABSTRACT

A semiconductor structure for a dynamic random access memory (DRAM) cell array that includes a plurality of vertical memory cells built on a semiconductor-on-insulator (SOI) wafer and a body contact in the buried dielectric layer of the SOI wafer. The body contact electrically couples a semiconductor body with a channel region of the access device of one vertical memory cell and a semiconductor substrate of the SOI wafer. The body contact provides a current leakage path that reduces the impact of floating body effects upon the vertical memory cell. The body contact may be formed by an ion implantation process that modifies the stoichiometry of a region of the buried dielectric layer so that the modified region becomes electrically conductive with a relatively high resistance.

9 Claims, 9 Drawing Sheets

U.S. PATENT DOCUMENTS

| | | | |
|---|---|---|---|
| 6,492,233 | B2 | 12/2002 | Forbes et al. |
| 6,500,710 | B2 * | 12/2002 | Nakagawa ................. 438/257 |
| 6,509,613 | B1 | 1/2003 | En et al. |
| 6,521,938 | B2 * | 2/2003 | Hamamoto ................. 257/304 |
| 6,531,375 | B1 | 3/2003 | Giewont et al. |
| 6,566,177 | B1 | 5/2003 | Radens et al. |
| 6,570,208 | B2 | 5/2003 | Mandelman et al. |
| 6,576,945 | B2 | 6/2003 | Mandelman et al. |
| 6,593,205 | B1 | 7/2003 | Chen et al. |
| 6,593,612 | B2 | 7/2003 | Gruening et al. |
| 6,794,716 | B2 | 9/2004 | Park et al. |
| 6,812,114 | B2 | 11/2004 | Chen et al. |
| 6,825,545 | B2 * | 11/2004 | Nasr ......................... 257/532 |
| 6,913,968 | B2 | 7/2005 | Cheng et al. |
| 6,946,700 | B2 | 9/2005 | Noble |
| 6,964,897 | B2 | 11/2005 | Bard et al. |
| 2004/0238868 | A1 | 12/2004 | Arnold et al. |
| 2004/0250221 | A1 * | 12/2004 | Bard et al. ..................... 716/1 |
| 2005/0085096 | A1 | 4/2005 | Low et al. |
| 2006/0175660 | A1 | 8/2006 | Cheng et al. |
| 2006/0202249 | A1 * | 9/2006 | Cheng et al. ................. 257/301 |
| 2007/0045697 | A1 | 3/2007 | Cheng et al. |
| 2007/0045698 | A1 | 3/2007 | Cheng et al. |
| 2008/0044959 | A1 | 2/2008 | Cheng et al. |
| 2008/0050873 | A1 | 2/2008 | Cheng et al. |

OTHER PUBLICATIONS

Office Action issued in related U.S. Appl. No. 11/216,386; dated as mailed on Oct. 9, 2007; 16 pages; USPTO.

Office Action issued in related U.S. Appl. No. 11,216,395; dated as mailed on Mar. 19, 2008; 16 pages; USPTO.

Office Action issued in related U.S. Appl. No. 11,216,395; dated as mailed on Sep. 25, 2007; 19 pages; USPTO.

Office Action issued in related U.S. Appl. No. 11/216,395; dated as mailed on Mar. 15, 2007; 19 pages; USPTO.

Office Action issued in related U.S. Appl. No. 11/216,386, dated as mailed on Sep. 7, 2008; 12 pages; USPTO.

Office Action issued in related U.S. Appl. No. 11,216,386; dated as mailed on Mar. 13, 2008; 12 pages; USPTO.

Office Action issued in related U.S. Appl. No. 11/216,395; dated as mailed on Oct. 7, 2008; 18 pages; USPTO.

Maiti, et al., "Low-Pressure Chemical-Vapor-Deposited Silicon-Rich Oxides for Nonvolatile Memory Applications", Dec. 1992, IEEE Electron Device Letters, vol. 13, Issue 12, pp. 624-626.

Mandelman, et al., "Floating-Body Concerns for SOI Dynamic Random Access Memory (DRAM)", Oct. 1996 IEEE International SOI Conference (2 pages).

Mandelman, et al., "Challenges and Future Directions for the Scaling of Dynamic Random-Access Memory (DRAM)", IBM J. Res. & Dev. vol. 46 No. 2/3 Mar./May 2002 pp. 187-212.

Rosmeulen et al., "Electrical Characterisation of Silicon-Rich-Oxide Based Memory Cells Using Pulsed Current-Voltage Techniques", Sep. 2002, Solid State Device Research Conference, 2002. Proceeding of the 32nd European, pp. 471-474.

Final Office Action issued in related U.S. Appl. No. 11/216,386; dated as mailed on Feb. 23, 2009.

Office Action issued in related U.S. Appl. No. 11/928,135; dated as mailed on Feb. 3, 2009; 10 pages; USPTO.

Wolf, S. "Silicon Processing for the VLSI era" (California, Lattice Press, 1990), pp. 104 and 371.

Stephen W. Smoot (Examiner); Notice of Allowance issued in related patent application U.S. Appl. No. 11/928,135; dated as mailed on Jun. 22, 2009.

Hsin Yi Hsieh (Examiner); Office Action issued in related patent application U.S. Appl. No. 11/216,395; dated as mailed on Aug. 7, 2009.

* cited by examiner

BODY-CONTACTED SEMICONDUCTOR STRUCTURES AND METHODS OF FABRICATING SUCH BODY-CONTACTED SEMICONDUCTOR STRUCTURES

CROSS-REFERENCE TO RELATED APPLICATIONS

This application is a divisional of application Ser. No. 11/216,386, filed Aug. 31, 2005, which is hereby incorporated by reference herein in its entirety.

This application is related to commonly-assigned application Ser. No. 11/216,395, filed on Aug. 31, 2005, entitled "SEMICONDUCTOR STRUCTURES WITH BODY CONTACTS AND FABRICATION METHODS THEREOF", which is hereby incorporated by reference herein in its entirety.

FIELD OF THE INVENTION

The invention relates generally to semiconductor structures and, in particular, to semiconductor structures with multiple vertical memory cells arranged to form a memory array and methods of forming such semiconductor structures.

BACKGROUND OF THE INVENTION

Dynamic random access memory (DRAM) devices are the most commonly used type of semiconductor memory and, thus, are found in many integrated circuit designs. DRAM devices are also frequently embedded into application specific integrated circuits, such as processors and logic devices. A generic DRAM device includes a plurality of substantially identical semiconductor memory cell arrays, a plurality of bit lines, and a plurality of word lines that intersect the bit lines. Each memory cell array includes a plurality of memory cells arranged in rows and columns and each individual memory cell in the array is located at the intersection of a respective word line and a respective bit line.

Each individual memory cell includes a storage capacitor for storing data and an access device, such as a planar or vertical metal oxide semiconductor field-effect transistor (MOSFET), for allowing the transfer of data charges to and from the storage capacitor during reading and writing operations. Either the source or drain of the access device is connected to a corresponding bit line and the gate of the access device is connected to a corresponding word line. In certain DRAM device designs, memory cells are arranged in pairs to allow sharing of a bit line contact, which significantly reduces the overall memory cell size.

When the access device of one of the memory cells is activated by a signal on the word line, a data signal is transferred from the storage capacitor of the memory cell to the bit line connected to the memory cell or from the bit line connected to the memory cell to the storage capacitor of the memory cell. Because DRAM devices are a type of volatile memory that leaks stored charge, the data charge on the storage capacitor (corresponding to a "1" or "0") is periodically refreshed during a refresh operation.

When data stored in one of the memory cells is read onto one of the bit lines, a potential difference is generated between the bit line of the respective memory cell and the bit line of another memory cell, which form a data line pair. A bit line sense amplifier connected to the bit line pair senses and amplifies the potential difference and transfers the data from the selected memory cells to a data line pair.

One goal of memory device designers is to pack more memory cells more densely into a smaller integrated circuit. Vertical memory cells feature an architecture in which the storage capacitor and access device are stacked vertically in a common trench. Vertical memory cells afford increased packing densities and other advantages in comparison to planar memory cells, in which size reduction was realized in the past primarily by reduction of the linear dimensions (i.e., the minimum lithographic feature size, F). For example, the packing density of vertical memory cells in a DRAM device is increased because the length of the vertical access device channel is decoupled from the minimum lithographic feature size. Consequently, vertical memory cells lack the scaling problems with, for example, reducing the gate-oxide thickness and increasing the channel doping concentration encountered when scaling planar access devices to smaller sizes. The vertical memory cell architecture also allows longer channel lengths without a proportional decrease in memory density, as is true in planar memory cells. Channel length may also be properly scaled in vertical memory cells relative to gate oxide thickness and relative to junction depth to reduce channel doping, minimize junction leakage, and increase data retention times.

Constructing DRAM devices using semiconductor-on-insulator (SOI) technology offers many advantages over counterpart devices built in bulk semiconductor substrates including, but not limited to, higher performance, absence of latch-up, higher packing density, and low voltage applications. In SOI technology, a thin semiconductor layer, often referred to as an SOI layer, is electrically isolated from a thicker semiconductor substrate by an insulating or dielectric material, e.g., a buried oxide or BOX layer. The access devices for the memory cells are built in a portion of the SOI layer termed the SOI body.

Floating body effects occur in vertical memory cells built using SOI technology. SOI technology eliminates junction capacitance problems observed in comparable bulk devices by electrically isolating the SOI body of transistor-type access devices from the underlying semiconductor material of the substrate. However, the SOI body may float at a potential that varies according to various conditions in which the transistor-type access device is operated.

Floating body effects are known to significantly degrade cell data retention time, which is most evident in long data retention time memory cells. Floating body effects originate from the accumulation of charge carriers in the channel region of the access device defined in the SOI body. A resultant leakage current is established via a parasitic bipolar transistor structure arising from the accumulated charge carriers. If uncompensated, the leakage current gradually discharges the storage capacitor. Floating body effects also cause fluctuations in the threshold voltage for the memory cell arising from the charge build up, which is extremely detrimental to conventional operation of transistor-type access devices.

What is needed, therefore, is a semiconductor structure for an SOI DRAM cell array with improved cell data retention times and methods of fabricating such semiconductor structures that overcome the disadvantages of conventional semiconductor structures and conventional methods of manufacturing such semiconductor structures.

SUMMARY OF THE INVENTION

The present invention is generally directed to a semiconductor-on-insulator (SOI) structure that incorporates a body contact extending through the buried dielectric layer and, thereby, coupling an SOI body with an underlying semiconductor substrate and methods of forming such body contacts, desirably, with an ion implantation process. The structure improves the cell data retention time for a vertical memory cell in an SOI dynamic random access memory (DRAM) device by reducing floating body effects that, if uncompensated, may affect the memory cell access device and result in charge loss from the associated storage capacitor in the vertical memory cell. Specifically, charge carriers that would otherwise accumulate in the channel region of the access device are drained or discharged through a high-resistance leakage path defined by the body contact that extends to the underlying semiconductor substrate.

In accordance with one aspect of the present invention, a semiconductor structure comprises a semiconductor wafer including a semiconductor substrate, a semiconductor layer including a plurality of semiconductor bodies, a buried dielectric layer separating the semiconductor substrate from the semiconductor body, and a plurality of memory cells built in an array on the semiconductor wafer. Each of the memory cells includes a storage capacitor and an access device. The access device has a vertical channel defined in one of the semiconductor bodies and a gate configured to switch current flow through the vertical channel to the storage capacitor. The structure further comprises a body contact in the buried dielectric layer. The body contact electrically couples one of the semiconductor bodies with the semiconductor substrate.

In accordance with another aspect of the invention, a method for forming a semiconductor structure in a semiconductor wafer includes forming a plurality of trenches in a semiconductor wafer including a semiconductor substrate, a semiconductor layer with a plurality of semiconductor bodies, and a buried dielectric layer separating the semiconductor substrate from the semiconductor layer, and then building a memory cell in each of the trenches. The method further includes forming a body contact that extends substantially through the buried dielectric layer and electrically couples one of the semiconductor bodies with the semiconductor substrate.

BRIEF DESCRIPTION OF THE DRAWINGS

The accompanying drawings, which are incorporated in and constitute a part of this specification, illustrate embodiments of the invention and, together with a general description of the invention given above and the detailed description of the embodiments given below, serve to explain the principles of the invention.

DETAILED DESCRIPTION

The present invention provides a semiconductor structure including an array of vertical memory cells built using semiconductor-on-insulator (SOI) technology, as well as methods of making such semiconductor structures. Specifically, the access device for at least one vertical memory cell and, typically, every vertical memory cell in the memory cell array has an associated relatively high-resistance body contact established through the buried insulating or dielectric layer separating the floating SOI body of an SOI wafer, in which the access device is built, from the underlying semiconductor substrate. The present invention may be particularly applicable and beneficial for merged isolation and node trench (MINT) memory cells, although the invention is not so limited. The requisite high resistance for the body contact may be achieved by creating a localized silicon rich oxide (SRO) region of relatively high resistance in the buried dielectric layer. The present invention will now be described in greater detail by referring to the drawings that accompany the present application.

Figure 1:
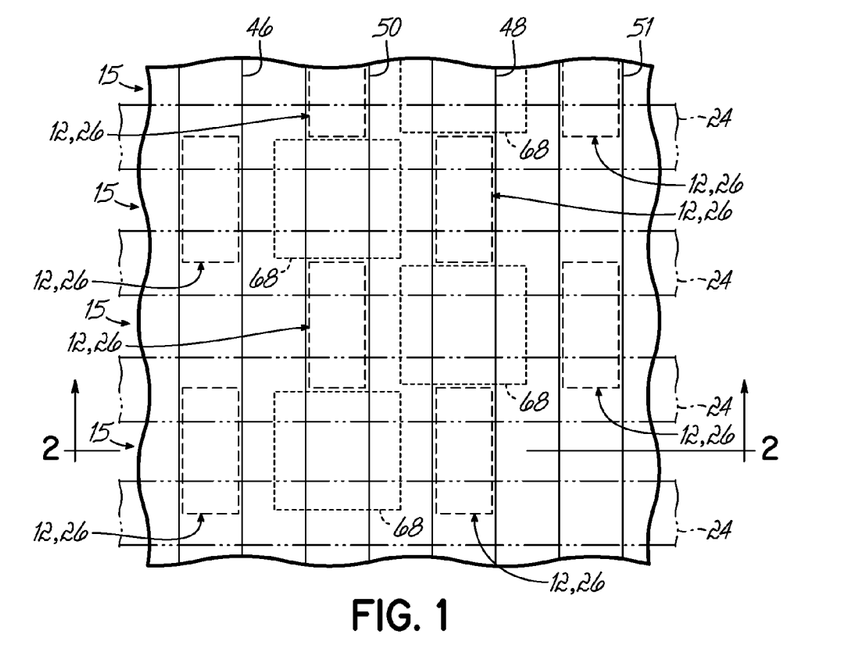
FIG. 1 is a top plan view of an array of vertical memory cells built on a portion of a semiconductor-on-insulator substrate in accordance with an embodiment of a processing method of the invention and in which the bit lines are omitted for purposes of clarity in describing the invention.
Figure 2:
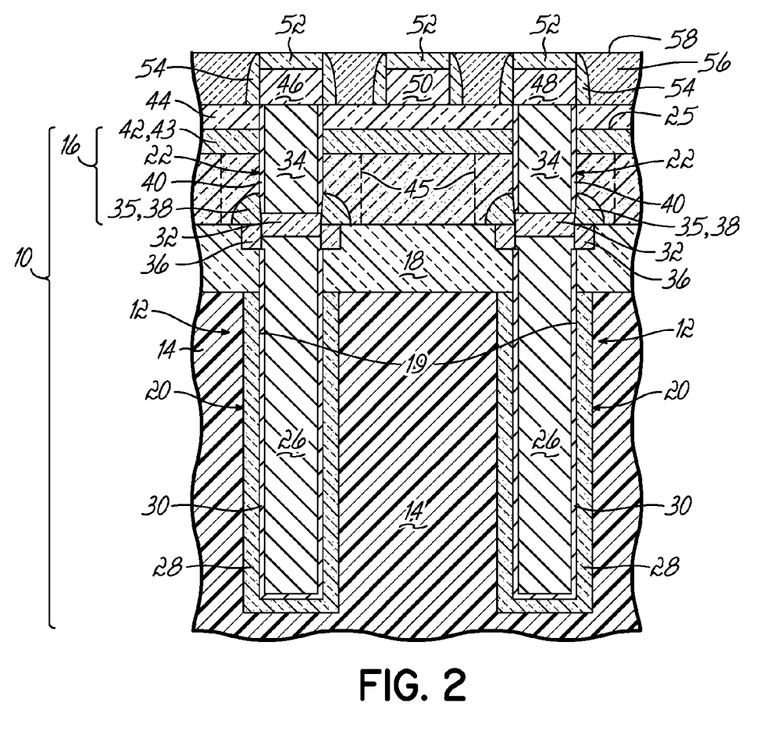
FIG. 2 is a diagrammatic cross-sectional view of the substrate portion of FIG. 1 taken generally along lines 2-2.

With reference to FIGS. 1 and 2, a portion of a semiconductor wafer 10 is shown that includes multiple substantially identical vertical memory cells, generally indicated by reference numeral 12, that are arranged in electrically-isolated pairs of a considerably larger DRAM device built on semiconductor wafer 10. The larger DRAM device may constitute, but is not limited to, a plurality of substantially identical memory cells 12 each having a known eight square feature or 8F2 DRAM cell, as depicted in FIG. 1, and a plurality of substantially identical 8F2 DRAM cells arranged in a larger array across the semiconductor wafer 10. A bit of data can be stored as a data charge in each of the 8F2 DRAM cell arrays.

Before building the vertical memory cells 12, SOI semiconductor wafer 10 comprises a semiconductor substrate 14, which is typically a single crystal or monocrystalline bulk silicon substrate and may be doped with a p-type dopant, a buried insulating or dielectric layer, which may be a buried oxide (BOX) layer 18, and an SOI body 16 of a larger semiconductor layer separated from the semiconductor substrate 14 by the intervening buried dielectric layer 18. The SOI body 16, which is considerably thinner than the semiconductor substrate 14 and is also typically single crystal or monocrystalline silicon, is electrically isolated from the semiconductor substrate 14 by the BOX layer 18. The semiconductor wafer 10 may be fabricated by any suitable conventional technique, such as a wafer bonding technique or a separation by implantation of oxygen (SIMOX) technique, familiar to persons of ordinary skill in the art.

The stoichiometry of the BOX layer 18 may be expressed by the chemical or molecular formula $SiO_x$, where the variable x represents the nominal proportion of oxygen atoms to silicon atoms in the constituent compound and may have any suitable value. For example, if x is equal to 2, the BOX layer 18 is stoichiometric with a stoichiometric ratio of two oxygen atoms per silicon atom and a molecular formula expressed as $SiO_2$.

Device isolation regions 24 (FIG. 1) are defined between adjacent rows of vertical memory cells 12 in the cell array, such that the memory cells 12 are paired together. One specific pair of electrically-isolated memory cells 12 is shown in FIG. 2. These device isolation regions 24 may be formed by, for example, a shallow trench isolation (STI) technique that includes a conventional lithography and dry etching process to create trenches followed by filling the trenches with a dielectric material, such as an oxide anisotropically deposited by a high density plasma (HDP) chemical vapor deposition (CVD) process, and then planarization with a conventional chemical mechanical planarization (CMP) process. The device isolation regions 24 partition the SOI body 16 into isolated active area regions or islands 15 on the BOX layer 18 and, thereby, assist in preventing carrier migration between adjacent memory cells 12. Each of the islands 15 may be considered to used in the construction of a pair of memory cells 12.

Each of the vertical memory cells 12 is formed in a corresponding one of a plurality of trenches 19. Each of the trenches 19 extends into the semiconductor wafer 10 at locations dispersed across the surface of wafer 10. Each trench 19, which is formed by a conventional lithography and etching process familiar to a person having ordinary skill in the art, extends from a top planar surface 25 of the semiconductor wafer 10 through the SOI body 16 and the BOX layer 18 and continues for a depth into the semiconductor substrate 14 underlying the BOX layer 18.

Each memory cell 12 includes a storage capacitor 20, typically having the form of a deep trench (DT) capacitor, and an access device 22, typically having the form of a vertical metal oxide semiconductor field-effect transistor, that are disposed within the trench 19 with a vertically stacked arrangement. The access device 22 is electrically coupled with the storage capacitor 20 for allowing the transfer of data charges to and from the storage capacitor 20 during reading and writing operations of the DRAM device. Because the memory cells 12 are substantially identical, the constituent features of one pair of memory cells 12 will be described with the understanding that this description applies to all equivalent pairs of memory cells 12 in the memory cell array and DRAM device.

The storage capacitor 20 of each vertical memory cell 12 is located in a bottom or lower portion of the trench 19. The storage capacitor 20 includes a capacitor node or plate 26 constituted by a conductor, such as $n^+$-doped polycrystalline silicon (i.e., polysilicon). The capacitor plate 26, which includes a portion that projects vertically into the BOX layer 18, is electrically isolated from the SOI body 16 by the BOX layer 18. A buried capacitor plate 28 is present in the material of the semiconductor substrate 14 bordering a lower portion of the trench 19. Buried plate doping may be formed by conventional processes such as out-diffusing an n-type dopant like arsenic from a layer of dopant-doped silicon glass on the sidewall of trench 19, gas phase doping, plasma doping, plasma immersion ion implantation, or any combination of these processes that are well known to a person having ordinary skill in the prior art.

A thin node dielectric 30, which lines the lower portion of trench 19, separates and electrically isolates the buried capacitor plate 28 from capacitor plate 26. The node dielectric 30 may be any suitable dielectric material, including but not limited to silicon oxide, silicon nitride, silicon oxynitride, aluminum oxide, combinations of these dielectric materials, or another high-k material.

With continued reference to FIGS. 1 and 2, the access device 22 of each vertical memory cell 12 is situated in a top or upper portion of the trench 19 and, generally, is stacked vertically above the storage capacitor 20. A trench-top insulator 32, which typically has the form of a trench-top oxide, overlies the capacitor plate 26 vertically and electrically isolates a vertical gate 34 of the access device 22 from the capacitor plate 26. Oxide for the trench-top insulator 32 may be formed in trench 19 above capacitor plate 26 by a suitable conventional process, such as a HDP-CVD process. The vertical gate 34 is constituted by an electrically conductive material, such as polysilicon deposited in the upper portion of trench 19 using low-pressure CVD (LPCVD).

A buried deep strap connection 36 is provided in the BOX layer 18 vertically between the vertical gate 34 and the capacitor plate 26. An outdiffusion region 38, which originates from the n-type dopant (e.g., arsenic, phosphorous, or antimony) of buried deep strap connection 36 and may be produced during annealing of wafer 10, extends into the SOI body 16. The outdiffusion region 38 defines a lower source/drain region 35 of the access device 22, depending upon the operation of access device 22. Capacitor plate 26 of the storage capacitor 20 is tied to the lower source/drain region 35 of the access device 22 and buried capacitor plate 28 is tied to a reference potential or voltage. A thin gate oxide 40 is disposed on the vertical sidewall of trench 19 between the confronting sidewall of the vertical gate 34 and the SOI body 16.

A doped region 42, which may be formed by implantation or diffusion of an n-type dopant such as arsenic or phosphorous into the SOI body 16, is provided in an upper region of the SOI body 16 and is coextensive with surface 25. The doped region 42 defines an upper source/drain region 43 of the access device 22, depending upon the operation of access device 22. A vertical channel 45 is defined in the SOI body 16 near the vertical gate 34 and generally between the source/drain regions 35, 43 of the access device 22. Current flowing through channel 45 between the source/drain regions 35, 43 is controlled or switched by potential or voltage applied to the vertical gate 34. When the access device 22 is switched "on" by application of a suitable voltage to the vertical gate 34, channel 45 becomes electrically conductive to allow current flow between the source/drain regions 35, 43. The access device 22 is considered by a person having ordinary skill in the art to constitute a vertical device structure because of the three-dimensional vertical arrangement of the gate 34, the channel region 45, and the source/drain regions 35, 43.

An array top insulator 44, which overlies the doped region 42, operates to electrically isolate the source/drain region 43 from word lines 46, 48, 50, 51. The array top insulator 44 may be formed, for example, by depositing oxide using a conventional HDP CVD oxide process and optionally planarizing with a conventional planarization process, such as CMP.

Word line 46 is electrically coupled with the storage capacitor 20 of one vertical memory cell 12 visible in FIG. 2 by the underlying access device 22. A potential applied from word line 46 to vertical gate 34 controls the data charge on the storage capacitor 20 by selectively transferring current between the source/drain regions 35, 43 through the channel 45 in the SOI body 16. Similarly, word line 48 is electrically coupled with the storage capacitor 20 of the other memory cell 12 visible in FIG. 2 by the underlying access device 22. A potential applied from word line 48 to the vertical gate 34 of the access device 22 of this memory cell 12 likewise controls the data charge on the corresponding storage capacitor 20 by selectively transferring current between the source/drain regions 35, 43 through channel 45 in the SOI body 16. Source/drain region 43 of each access device 22 is further connected to a corresponding bit line (not shown).

To provide the electrical coupling, the vertical gate 34 of each access device 22 for the exemplary pair of vertical memory cells 12 visible in FIG. 2 is contacted by one of the word lines 46, 48. As a consequence, these word lines 46, 48 are referred to as active word lines. The other two word lines 50, 51, of which only word line 50 is visible in FIG. 2 and which do not contact either of the memory cells 12 visible in FIG. 2, are referred to as passing word lines. Word lines 50, 51, which are passing in FIG. 2, are connected with the access device 22 in other memory cells 12 in the memory cell array (FIG. 1) and in the DRAM device. Similarly, word lines 46, 48, which are active in FIG. 2, are not connected with the access device 22 of certain other memory cells 12 in the memory cell array (FIG. 1) and in the DRAM device. Consequently, as appreciated by a person having ordinary skill in the art, ascribing the terms active and passing to the word lines 46, 48, 50, 51 depends upon which specific pair of word lines 46, 48, 50, 51 is coupled with each electrically-isolated pair of memory cells 12 in the memory cell array and DRAM device.

Each of the word lines 46, 48, 50, 51 consists of one or more conducting layers constituted by a conductor, such as polysilicon, tungsten nitride (WN), tungsten (W), tungsten silicide (WSi), or combinations of these materials. Each of the word lines 46, 48, 50, 51 includes an electrically-insulating cap 52 of, for example, nitride stationed atop the conducting layer(s), and electrically-insulating sidewall spacers 54 of, for example, nitride flanking the conducting layer(s). Gaps between adjacent pairs of word lines 46, 48, 50, 51 are filled by a layer 56 of a suitable gap fill material, such as oxide or borophosphosilicate glass (BPSG). The material of the gap fill layer 56 is planarized by a conventional planarization process, such as CMP, to establish an upper horizontal surface 58 by relying on caps 52 as a polish stop.

Figure 3:
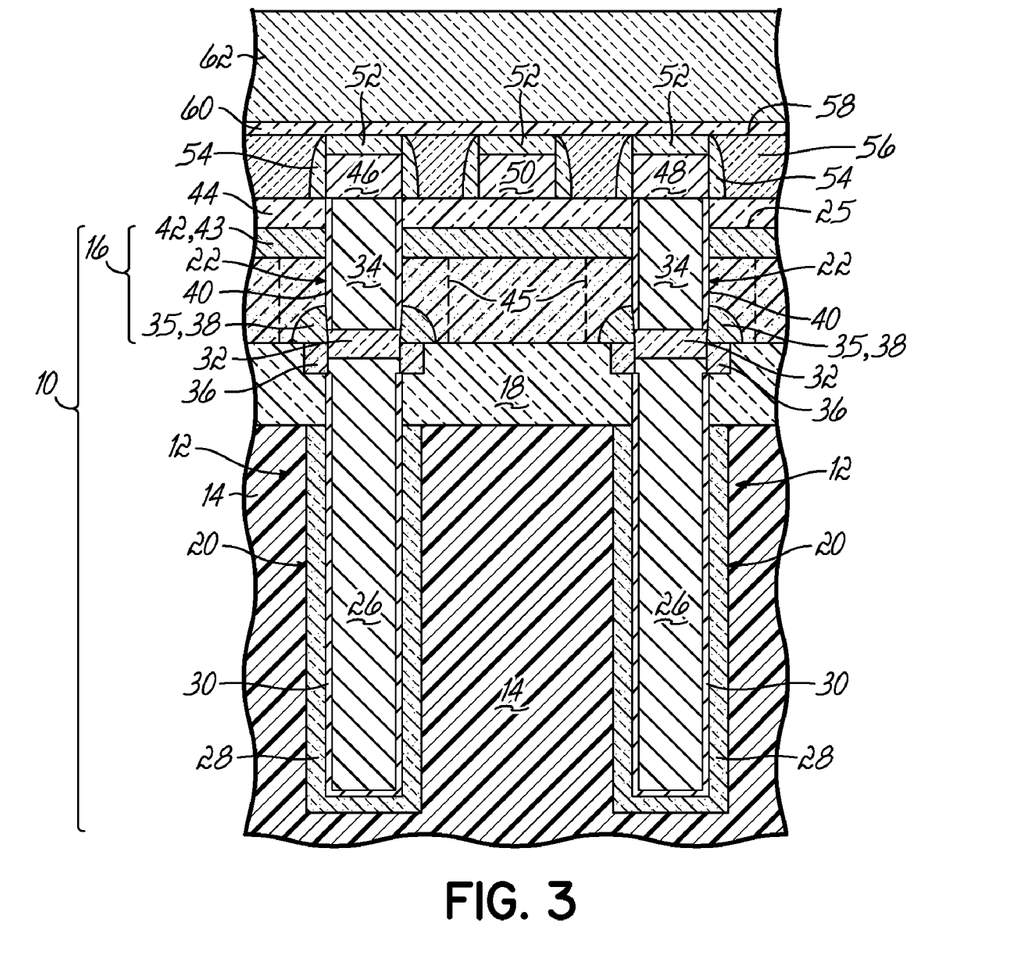
FIGS. 3-7 are diagrammatic cross-sectional views similar to FIG. 2 of the substrate portion at various subsequent fabrication stages in accordance with the embodiment of the processing method of the invention.

With reference to FIG. 3 in which like reference numerals refer to like features in FIG. 2 and at a subsequent fabrication stage, a relatively thin etch stop layer 60 is deposited on the upper horizontal surface 58. The etch stop layer 60 may be oxide ($SiO_2$) deposited by a conventional thermal CVD process. A relatively thick pad nitride layer 62 is formed on the etch stop layer 60. The pad nitride layer 62 may be composed of silicon nitride ($Si_3N_4$) formed utilizing a conventional deposition process, such as CVD or plasma-assisted CVD.

Figure 4:
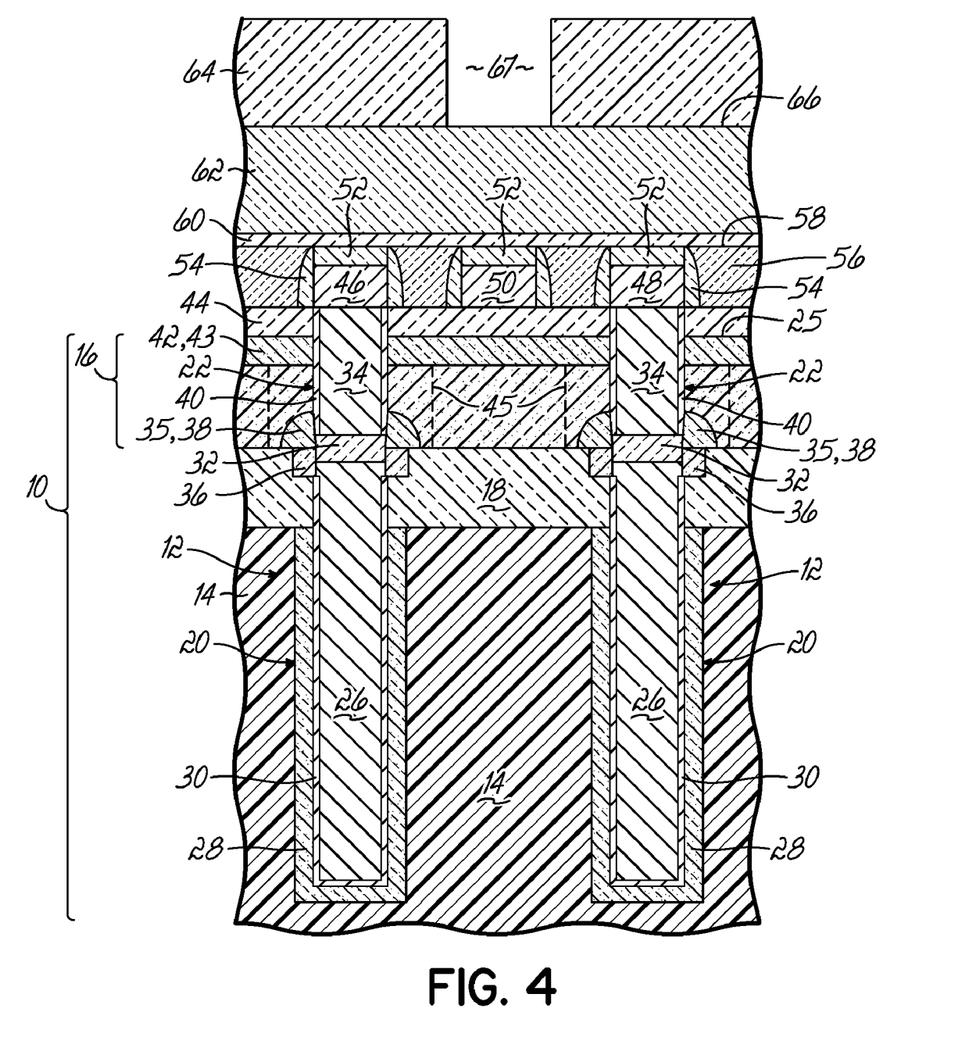
Figure 5:
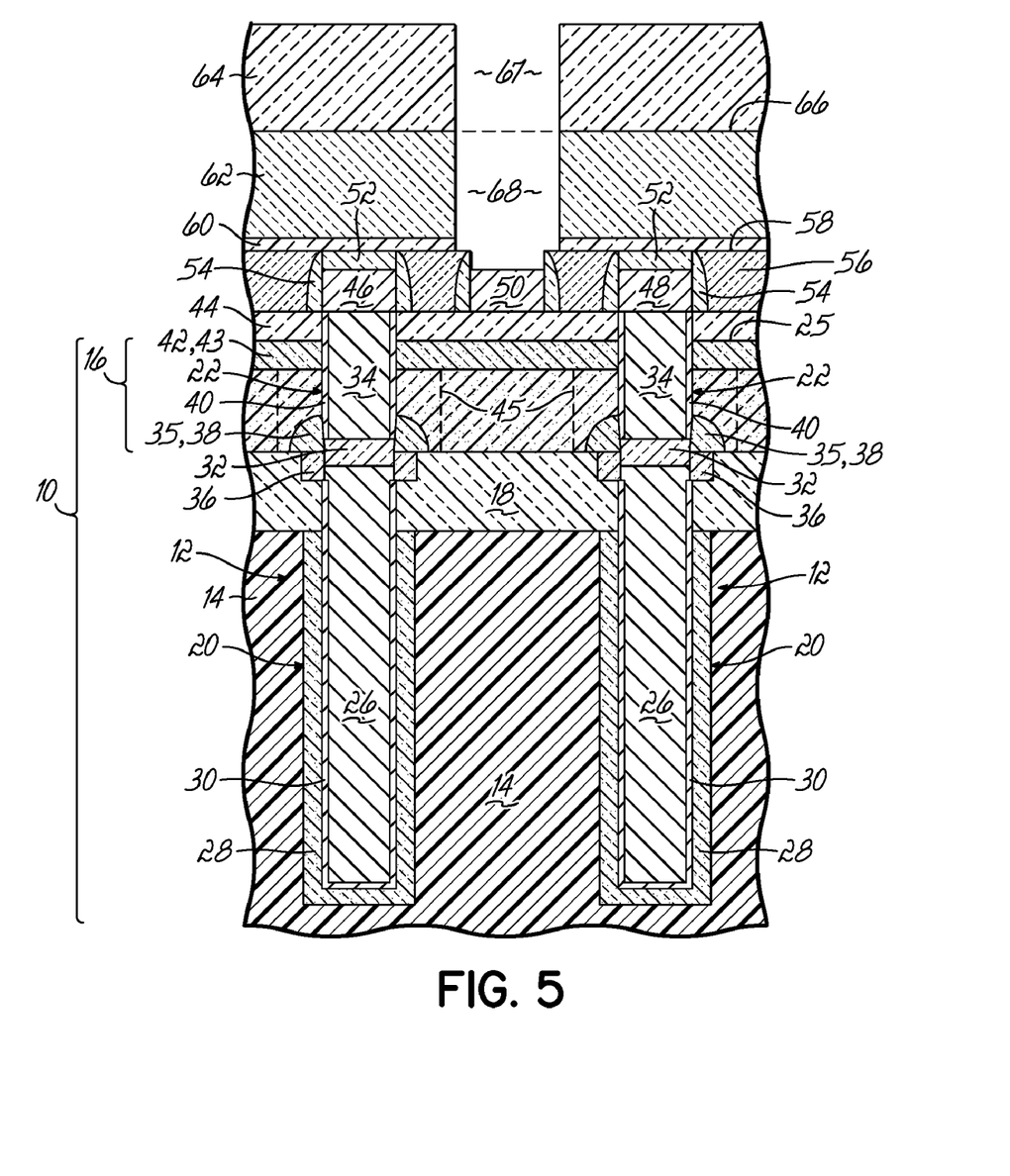

With reference to FIG. 4 in which like reference numerals refer to like features in FIG. 3 and at a subsequent fabrication stage, a body contact resist layer 64 is applied to an exposed planar surface 66 of the pad nitride layer 62 and patterned with openings 67 by any conventional lithography technique that exposes the resist layer 64 to a pattern of radiation defined by a body mask (not shown) and develops the transferred pattern in the exposed resist 64. Each of the openings 67 coincides with the future location of one of a plurality of body contact openings 68 (FIGS. 1, 5). Suitable lithography techniques for use in forming the openings 67 in the resist layer 64 include, but are not limited to, photolithography with or without phase shift, x-ray lithography, electron beam lithography, or a combination of these techniques.

With reference to FIG. 5 in which like reference numerals refer to like features in FIG. 4 and at a subsequent fabrication stage, a conventional anisotropic dry etching process selective to the material constituting the etch stop layer 60, such as reactive-ion etching (RIE) or plasma etching, is used to transfer the pattern of openings 67 from the resist layer 64 into the pad nitride layer 62 to the depth of the etch stop layer 60 and, thereby, initiate formation of the body contact openings 68. The chemistry of this etching process, which may be conducted in a single etching step or multiple steps, removes portions of the pad nitride layer 62 visible through the openings 67 in resist layer 64 and stops vertically on the etch stop layer 60. Each body contact opening 68 is further extended to the depth of the passing word line 50 by another conventional anisotropic dry etching process, such as RIE or plasma etching, that removes the constituent materials of the etch stop layer 60 and the insulating cap 52 selective to the electrically conductive material constituting the passing word line 50. The chemistry of this etching process, which may also be conducted in a single etching step or multiple steps, successively removes portions of the etch stop layer 60 and the insulating cap 52 on passing word line 50 visible through the body contact openings 68 and stops vertically on the electrically conductive material constituting the passing word line 50. This etching process also recesses the portion of the gap fill layer 56 exposed and circumscribed by the boundary of each body contact opening 68 and that overlies the corresponding device isolation region 24.

Figure 6:
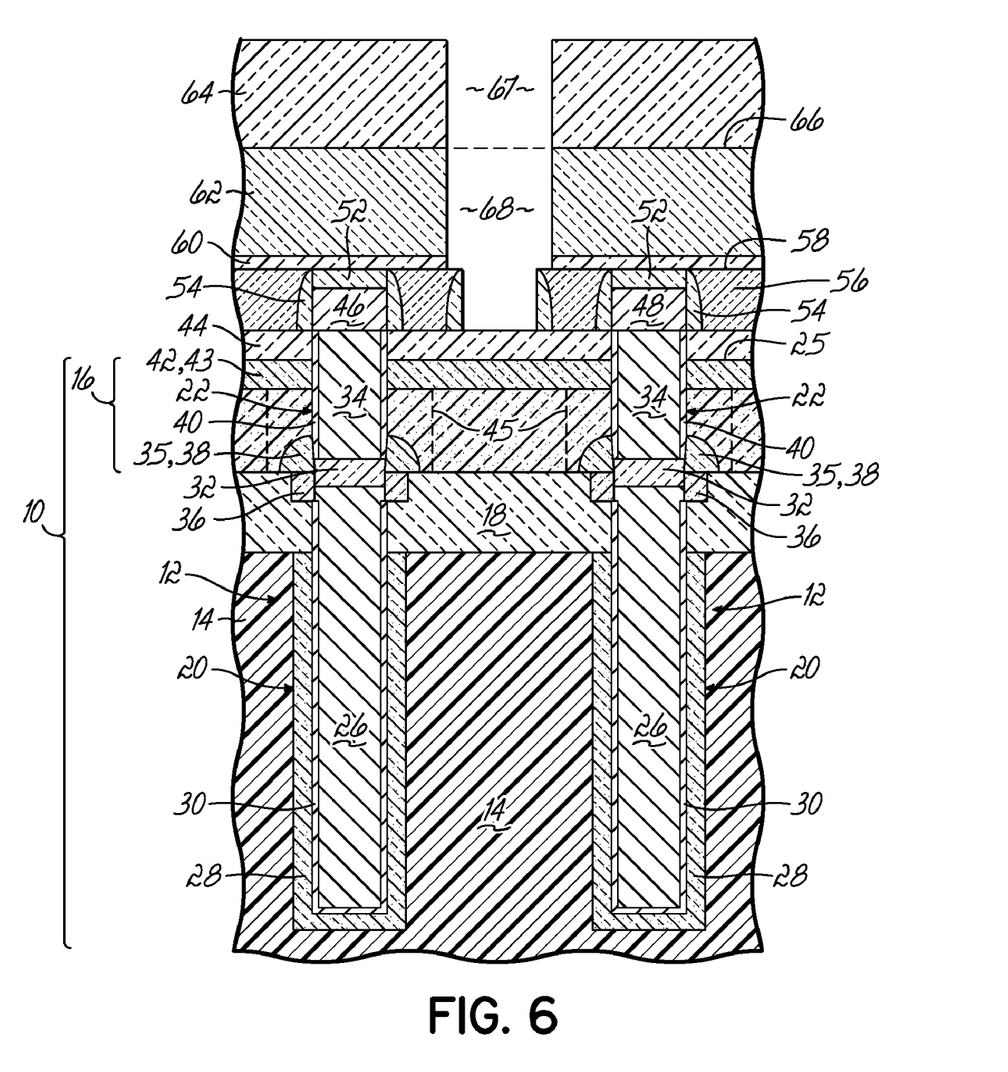

With reference to FIG. 6 in which like reference numerals refer to like features in FIG. 5 and at a subsequent fabrication stage, the portion of the conductor constituting the passing word line 50 exposed through each body contact opening 68 is removed by yet another conventional anisotropic dry etching process, such as RIE or plasma etching, selective to the material constituting the array top insulator 44. The chemistry of the etching process, which is conducted in one or more individual etching steps, removes a portion of each word line 50 visible through the corresponding one of the body contact openings 68 and stops vertically on the material constituting the array top insulator 44.

Figure 7:
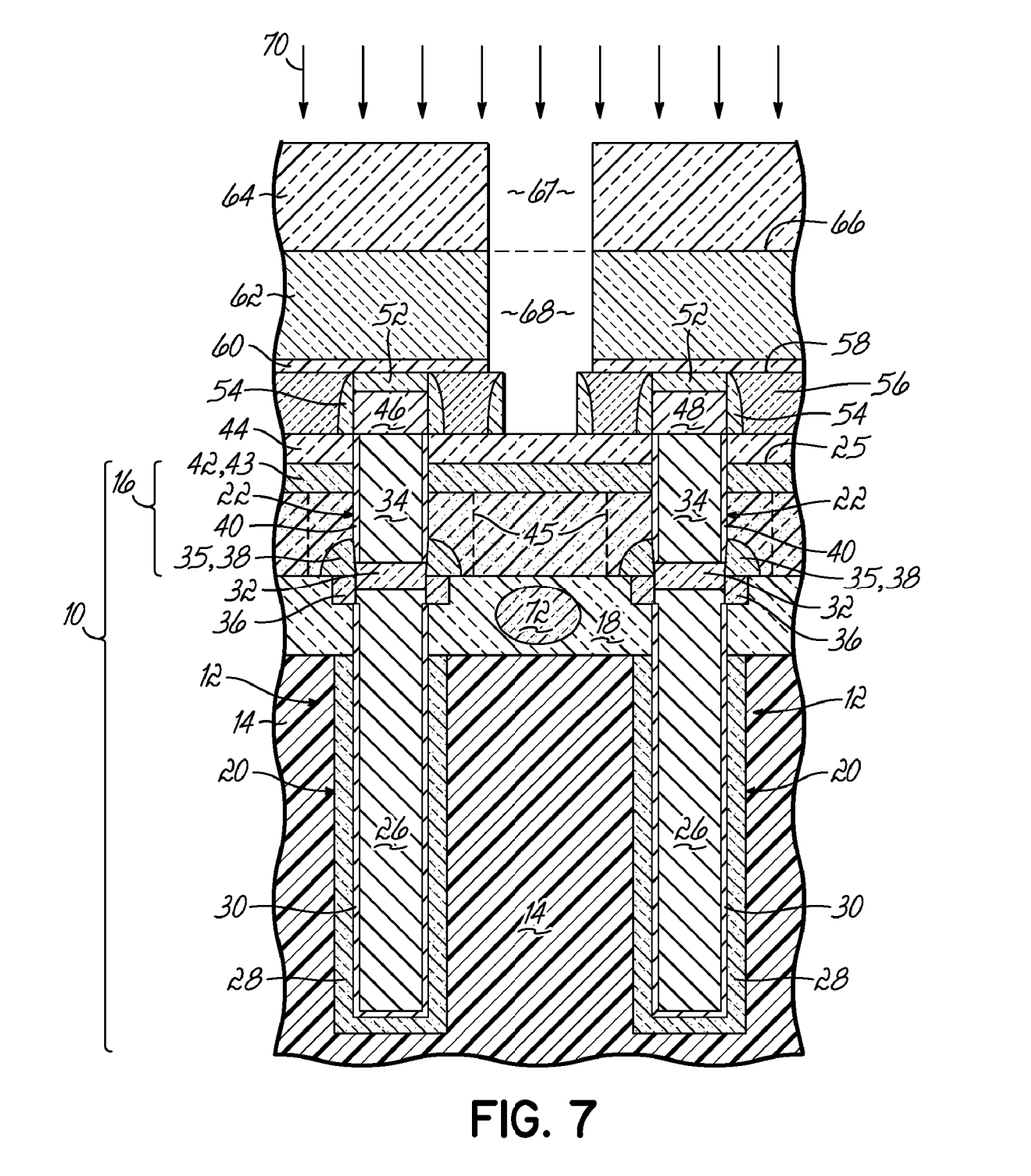

With reference to FIG. 7 in which like reference numerals refer to like features in FIG. 6 and at a subsequent fabrication stage, an ion implantation process is used to introduce silicon ions, as indicated diagrammatically by vertical arrows 70, into the semiconductor structure. Specifically, the implanted silicon ions 70 impinge the array top insulator 44 with near-normal incidence through a window defined by the openings 67 in resist layer 64 and the body contact openings 68 registered vertically with openings 67 in a self-aligned ion implantation process. The implanted silicon ions 70 penetrate successively through the array top insulator 44, the SOI body 16, and the BOX layer 18, and predominately come to rest in a depth profile extending into the BOX layer 18 to define a localized silicon rich oxide (SRO) region 72 within the BOX layer 18. Typically, the implantation of silicon ions 70 is performed with the semiconductor wafer 10 held at room or ambient temperature, although the invention is not so limited.

The SRO region 72 has a stoichiometry that differs from adjacent regions of the BOX layer 18 flanking SRO region 72, which are substantially unaffected by the ion implantation. The implanted silicon ions 70 locally modify the stoichiometry of the BOX layer 18 within the confines of the SRO region 72 such that the molecular formula of the resulting silicon-enriched compound of the SRO region 72 departs from the $SiO_x$ molecular formula of the laterally adjacent regions of the BOX layer 18. For example, if x is equal to 2 (i.e., $SiO_2$), the BOX layer 18 is stoichiometric and includes a stoichiometry characterized by a stoichiometric ratio of two oxygen atoms per every silicon atom, and the SRO region 72 has a silicon-enriched stoichiometry with a stoichiometric ratio in which fewer than two atoms of oxygen are associated with each silicon atom. As a more specific example, if the BOX layer 18 is $SiO_2$ and the average concentration of the implanted ions is six (6) atomic percent (at. %), the average stoichiometry of the SRO region 72 across the depth profile is 100 oxygen atoms per 56 silicon atoms.

The pad nitride layer 62 and resist layer 64 vertically mask underlying regions of the vertical memory cells 12 from the implanted silicon ions 70. In particular, the implanted silicon ions 70 do not penetrate or traverse the vertical gate 34 of the access device 22 of each adjacent memory cell 12, thus avoiding damage to the access device 22. The sidewall spacers 54 and a portion of the gap fill layer 56 exposed by the body contact opening 68 roughly define a lateral mask that sets the lateral boundaries of the SRO region 72. As a result, the lateral boundaries of the SRO region 72 coincide approximately with the now-open area formerly occupied by the removed portion of the passing word line 50, if lateral range straggle of the implanted silicon ions 70 is disregarded. This lateral masking self-aligns the implanted silicon ions 70 with the BOX layer 18 to enter only the SRO region 72 between the pair of adjacent memory cells 12. Portions of the BOX layer 18 that isolate the access device 22 from the storage capacitor 20 are unaffected by the implantation of silicon ions 70.

The kinetic energy of the implanted silicon ions 70 is adjusted to deliver the peak concentration in the resulting depth profile centered approximately within the thickness of the BOX layer 18 (i.e., near the mid-plane of the BOX layer 18). In order to provide the SRO region 72 with a suitable resistance, a suitable dose of implanted silicon ions 70 may range from about $1\times10^{13}$ to about $1\times10^{16}$ cm$^{-2}$. The kinetic energy of the implanted silicon ions 70 may range from about 50 keV to about 1000 keV (i.e., 1 MeV). The selection of a kinetic energy is contingent upon, among other parameters, the thickness and composition of the various layers in the layered structure (i.e., the array top insulator 44, the SOI body 16, and the BOX layer 18) that the ion trajectories traverse. Typically, the kinetic energy is selected such that the end-of-range tail of the depth profile for the implanted silicon ions 70 does not extend into the semiconductor substrate 14. Due to the vertical extent of the depth profile, a leading tail in the depth profile of the implanted silicon ions 70 will stop within the array top insulator 44 and the SOI body 16. However, the silicon concentration in this leading tail is significantly less than the concentration within the BOX layer 18 forming the SRO region 72.

As is apparent to a person ordinarily skilled in the art, a series of several relatively low dose implantations may be substituted for a single implantation of a higher implantation dose and/or a series of implantations at different kinetic energies (i.e., different ranges) may be substituted for a single implantation at one kinetic energy. In particular, sequential implantations at different kinetic energies and different doses may be required to establish an implanted depth profile of silicon in the SRO region 72 that extends substantially across or through the thickness of the BOX layer 18. Typically, the SRO region 72 bridges the entire thickness of the BOX layer 18.

The resulting stoichiometry of the BOX layer 18 in the SRO region 72 is enriched in silicon due to the introduction of excess silicon atoms by ion implantation. The enrichment may vary across the thickness of the BOX layer 18 due to the graded depth profile of silicon atoms. For example, the SRO region 72 may include about one (1) at. % to about six (6) at. % of silicon in excess of the initial $SiO_x$ stoichiometry of the BOX layer 18, which is understood to still exist in regions of the BOX layer 18 near the SRO region 72 that are substantially unaffected by the implantation. The silicon-rich stoichiometry of the SRO region 72 makes the BOX layer 18 between the SOI body 16 and the semiconductor substrate 14 locally leaky across the SRO region 72.

An optional thermal treatment may be performed at a substrate temperature in the range from about 700° C. to about 1050° C. to anneal any implantation damage in the SOI body 16 and/or to improve the conductivity of the SRO region 72. The thermal treatment may be performed in either an inert or vacuum environment, where an inert environment may comprise, for example, an atmosphere of helium (He), argon (Ar), or nitrogen ($N_2$).

The invention contemplates that, in the event that the dielectric layer represented by BOX layer 18 comprises a dielectric material other than $SiO_x$, the implanted species creating the SRO region 72 may depart from the exemplary silicon ions 70, as described herein, and may be selected accordingly to provide the local non-stoichiometry that supplies the leaky body contact between the SOI body 16 and the semiconductor substrate 14. The implanted species may or may not be an elemental component of the constituent dielectric material of BOX layer 18. For example, the implanted species may be germanium (Ge) if the BOX layer 18 is silicon oxide.

Figure 8:
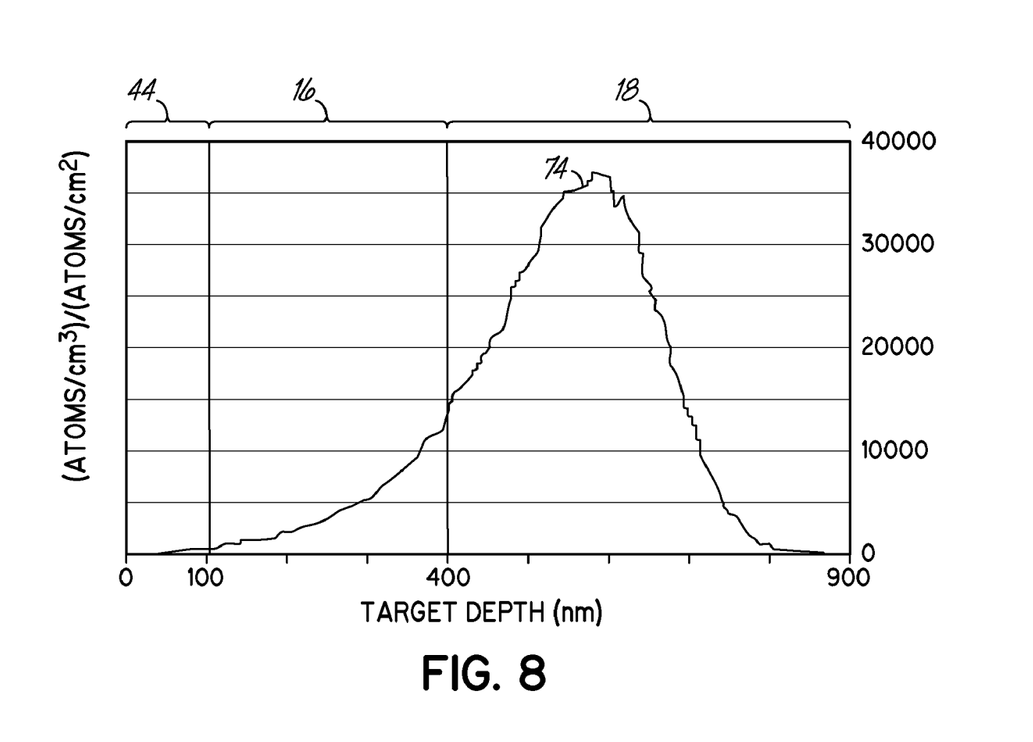
FIG. 8 is a schematic view of an implant profile simulation showing a predicted depth profile for implanted silicon ions having a concentration profile predominately located in a buried dielectric layer of the semiconductor-on-insulator substrate of FIG. 7.

With reference to FIG. 8, computer modeling may be used to predict a set of implantation conditions characterizing a predicted depth profile 74 that is capable of forming the SRO regions 72 (FIG. 7). The predicted depth profile 74 is representative of the actual depth profile of the implanted silicon ions 70 (FIG. 7) and provides an indication as to an appropriate ion energy and dose given a specific layer construction for the semiconductor wafer 10 and memory cell 12. The set of implantation conditions may subsequently be used to perform the actual ion implantation process with silicon ions 70 to create the SRO regions 72.

The predicted depth profile 74 may be simulated on a suitable computing platform by implementing any of various publicly available implantation simulation software programs that model the implantation process. For example, the predicted depth profile 74 may be determined using a Monte-Carlo simulation program, such as the widely-available TRIM software application that relies on a quantum mechanical treatment of ion-atom collisions, as described in the book, "The Stopping and Range of Ions in Solids", by J. F. Ziegler, J. P. Biersack, and U. Littmark, Pergammon Press, New York, 1985, to calculate the depth profile of ions implanted into matter consisting of compound materials with multiple layers, each of different materials. The implantation dose is optimized by the TRIM software given the implanted ion type and target materials and dimensions.

As a specific example, the predicted depth profile 74 may be determined for an exemplary layered construction for the memory cell array in which the array top insulator 44 is silicon oxide and has a thickness of 100 nm, the SOI body 16 is silicon and has a thickness of 300 nm, and the BOX layer 18 is oxide and has an arbitrary thickness. The implanted ion species is $Si^+$ and the ion kinetic energy is 400 keV, which produces a calculated range of about 530 nm and a calculated range straggle of about 122 nm. The depth profile 74 falls predominantly within the vertical boundaries of the BOX layer 18 and has a peak concentration in the BOX layer 18 at a depth of about 130 nm beneath the interface between the SOI body 16 and the BOX layer 18. As a result and taking into consideration the range straggle, this selection of implantation conditions is suitable if the BOX layer 18 has a thickness of about 300 nm so that the SRO region 72 substantially spans the entire thickness of the BOX layer 18.

Figure 9:
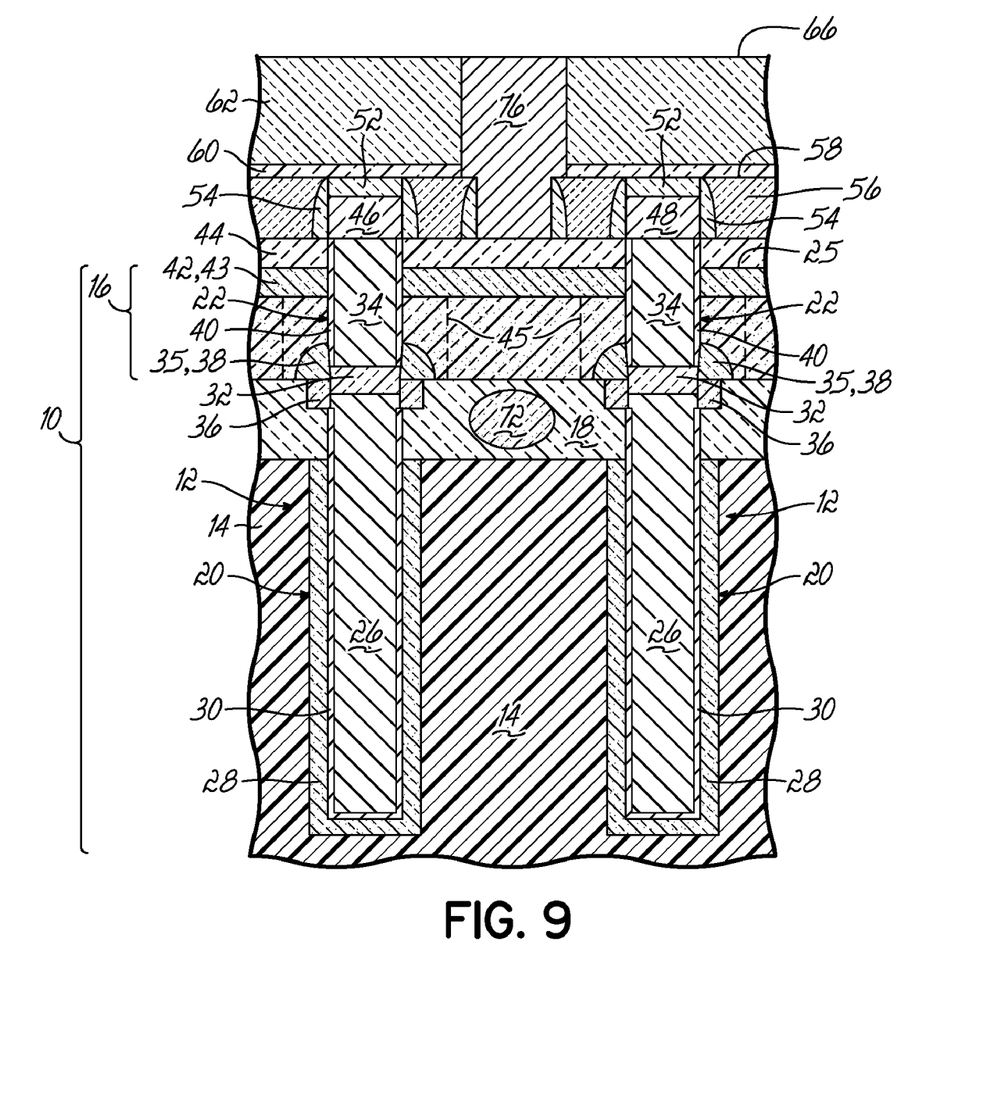
FIGS. 9 and 10 are diagrammatic cross-sectional views similar to FIG. 7 of the substrate portion at various subsequent fabrication stages of the embodiment of the processing method of the invention.

With reference to FIG. 9 in which like reference numerals refer to like features in FIG. 7 and at a subsequent fabrication stage, the body contact resist layer 64 is stripped to expose an upper horizontal surface 66 of the pad nitride layer 62. A layer of an electrically conductive fill material, such as polysilicon or doped polysilicon, is deposited by a conventional process on surface 66. A portion of the conductive fill material fills each body contact opening 68 with an electrically conductive plug 76.

Figure 10:
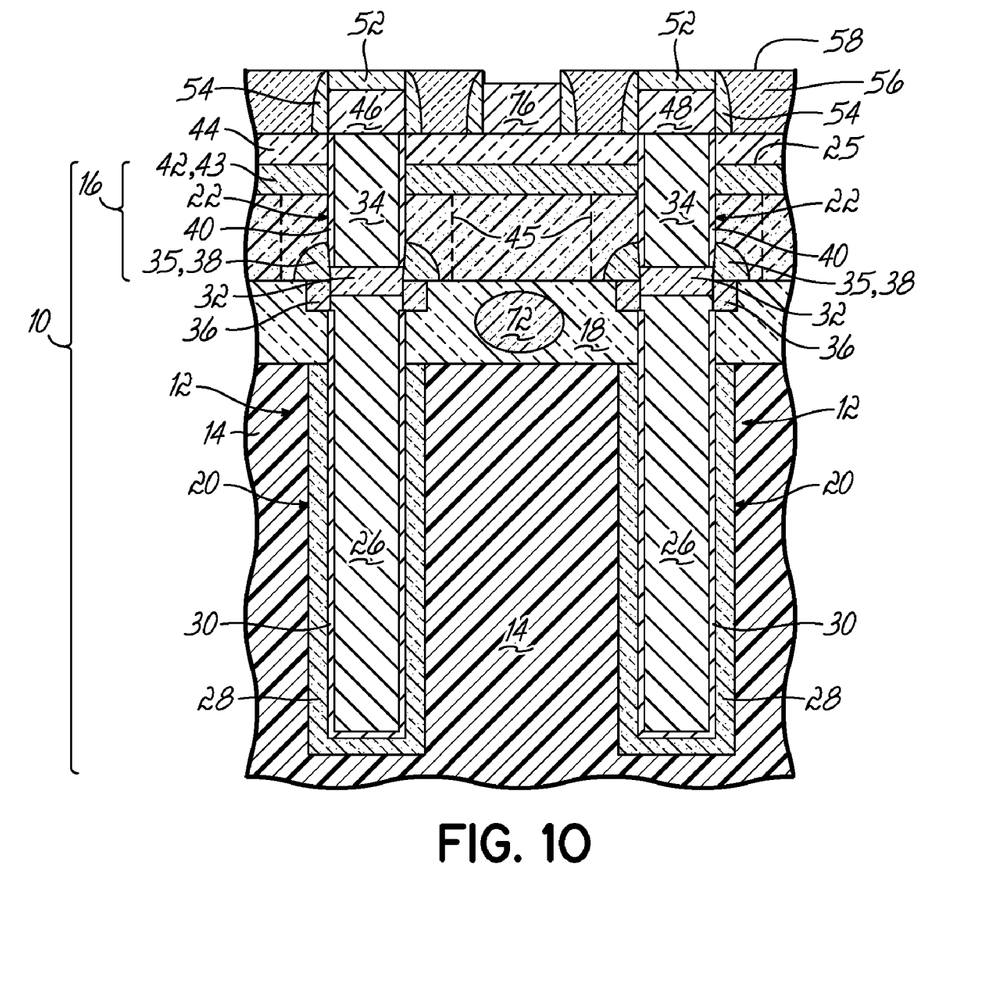

With reference to FIG. 10 in which like reference numerals refer to like features in FIG. 9 and at a subsequent fabrication stage, the semiconductor structure of FIG. 9 is planarized by a conventional planarization process, such as CMP, that stops vertically on the upper horizontal surface 66 of the pad nitride layer 62. The planarization process removes excess conductive fill material from surface 66 to re-expose the pad nitride layer 62. The pad nitride layer 62 is stripped by an etch process that removes the material of the pad nitride layer 62 selective to the materials constituting etch stop layer 60. For example, a wet isotropic etch process using hot acid, such as phosphoric acid, may be employed to remove $Si_3N_4$ relative to oxide. The etch stop layer 60 is removed by a conventional planarization process, such as a CMP process, that stops vertically at the upper horizontal surface 58 by relying on the caps 52 as a polish stop.

The upper surface of the conductive plug 76 is recessed by, for example, an anisotropic dry etch process selective to the constituent material of etch stop layer 60. In particular, the etch process recesses the conductive plug 76 to a depth below planar surface 58 and, therefore, below with the upper surfaces of the gap fill layer 56 and the caps 52. The conductive plug 76 re-establishes the continuity of the passing word line 50.

After the SRO regions 72 and conductive plugs 76 are formed, normal processing is used to complete the DRAM integrated circuit as understood by a person having ordinary skill in the art. Normal processing may include, but is not limited to, deposition of an interlayer dielectric such as BPSG or another suitable insulator, formation of the borderless bit line contacts and bit lines, and formation of higher level metallizations and insulating layers. Each SRO region 72 electrically couples the SOI body 16 of the access device 22 with the semiconductor substrate 14 to define a leaky current path therebetween. In each instance, the body contact opening 68 is established by removing a portion of one of the word lines 46, 48, 50, 51 that is passing for each particular pair of memory cells 12 and between each pair of memory cells 12. Each body contact or SRO region 72 serves a pair of access devices 22 in a contiguous island 15 of monocrystalline semiconductor defined by the SOI body 16 on SOI wafer 10.

It should be noted that one embodiment of the present invention is described herein with semiconductor structures being doped for a particular device type, i.e. n-type FET's (N-channel FET's). However, the invention is not so limited as a person having ordinary skill would understand how to replace N-channel FET's with p-type FET's (P-channel FET's) and n-type dopant with p-type dopant (e.g., boron or indium) where appropriate without departing from the spirit or scope of the invention.

The present invention provides various advantages in comparison with the construction of conventional DRAM cell arrays. In particular, the present invention provides for ultra-scalable and high performance SOI vertical array DRAM device having a high-resistance body contact to potentially eliminate and, at the least, significantly reduce the floating body effect by providing a conduction or leakage path through the BOX layer 18 from the SOI body 16 to the semiconductor substrate 14. The present invention is compatible with the current DRAM and enhanced dynamic random access memory (eDRAM) processes. The present invention is easy to implement in a circuit design and cost-effective, which is beneficial for purposes of manufacturability.

The present invention is based upon the realization that a high-resistance body contact, defined by the SRO region 72, is sufficient for body charge equilibration in the access device 22 of long data retention time DRAM device and enables the use of a leaky BOX layer 18 as a high-resistance conduction or leakage path. The leaky interface between the BOX layer 18 and SOI body 16 supplied by the SRO region 72 provides a relatively low interface carrier recombination velocity. The beneficial result is that the leakage current from storage capacitor 20, arising from diffusion of charge carriers to this interface, is significantly reduced. Although Applicants do not wish to be bound by theory, it is believed that the relatively low body currents required for steady-state charge equilibration and the relatively low body capacitance dictate the benefit of a relatively high resistance body contact. For example, a body contact resistance of less than 10 Megohms per cell (about $10^5$ ohm-$um^2$ for 90 nm ground rules) is believed sufficient to maintain the body at an equilibrated condition within 1 nanosecond (ns) of a disturbance. In particular, a body contact resistance of less than 1000 Gigohms per cell is believed to be sufficient for sinking reasonably anticipated generation currents if the cell is sitting in standby.

References herein to terms such as "vertical", "horizontal", etc. are made by way of example, and not by way of limitation, to establish a frame of reference. The term "horizontal" as used herein is defined as a plane parallel to the conventional plane or surface of semiconductor wafer 10, before processing and regardless of the actual spatial orientation of semiconductor wafer 10. The term "vertical" refers to a direction perpendicular to the horizontal, as just defined. Terms, such as "on", "above", "below", "side" (as in "sidewall"), "higher", "lower", "over", "beneath" and "under", are defined with respect to the horizontal plane. It is understood that various other frames of reference may be employed for describing the present invention without departing from the spirit and scope of the present invention.

The fabrication of the semiconductor structure herein has been described by a specific order of fabrication stages and steps. However, it is understood that the order may differ from that described. For example, the order of two or more fabrication steps may be switched relative to the order shown. Moreover, two or more fabrication steps may be conducted either concurrently or with partial concurrence. In addition, various fabrication steps may be omitted and other fabrication steps may be added. It is understood that all such variations are within the scope of the present invention. It is also understood that features of the present invention are not necessarily shown to scale in the drawings.

While the present invention has been illustrated by a description of various embodiments and while these embodiments have been described in considerable detail, it is not the intention of the applicants to restrict or in any way limit the scope of the appended claims to such detail. Additional advantages and modifications will readily appear to those skilled in the art. Thus, the invention in its broader aspects is therefore not limited to the specific details, representative apparatus and method, and illustrative example shown and described. Accordingly, departures may be made from such details without departing from the spirit or scope of applicants' general inventive concept.

What is claimed is:

1. A method for forming a semiconductor structure in a semiconductor wafer including a semiconductor substrate, a semiconductor layer including a semiconductor body, and a buried dielectric layer separating the semiconductor substrate from the semiconductor layer, the method comprising:
    forming a first trench that extends through the semiconductor body and the buried dielectric layer into the semiconductor substrate;
    building a first vertical memory cell in the first trench; and
    implanting ions into a region of the buried dielectric layer to form a body contact that electrically couples the semiconductor body with the semiconductor substrate.

2. The method of claim 1 wherein the buried dielectric layer is a buried oxide layer containing silicon and oxygen in a first stoichiometry, and implanting ions further comprises:
    implanting silicon ions into the region of buried oxide layer to provide a second stoichiometry in the implanted region that differs from the first stoichiometry.

3. The method of claim 2 wherein an implanted dose of silicon ions is sufficient to sufficient to provide a second stoichiometry including about 1 atomic percent to about 6 atomic percent of silicon in excess of the first stoichiometry of the buried oxide layer.

4. The method of claim 1 further comprising:
   forming a second trench that extends through the semiconductor body and the buried dielectric layer into the semiconductor substrate;
   building a second vertical memory cell the second trench;
   forming an insulating layer on the semiconductor body;
   building a plurality of word lines on the semiconductor wafer including a first word line on the insulating layer between the first and second memory cells and electrically isolated from the first and second memory cells; and
   removing a portion of the first word line to provide a body contact opening that exposes an area of the insulating layer overlying a region in the buried dielectric layer in which the body contact is subsequently formed.

5. The method of claim 4 wherein the ions are implanted into the region in the buried dielectric layer through the body contact opening.

6. The method of claim 5 wherein the implanted ions penetrate through the insulating layer area and an area of the semiconductor body registered vertically with the insulating layer area to reach the buried dielectric layer region.

7. The method of claim 6 wherein implanting ions further comprises:
   selecting a kinetic energy of the implanted ions such that the implanted ions stop predominantly in the buried dielectric layer underlying the removed portion of the first word line to define the body contact.

8. The method of claim 4 wherein the word lines further include a second word line connected with an access device of the first vertical memory cell and a third word line connected with an access device of the second vertical memory cell, the second and third word lines electrically isolated from the first word line.

9. The method of claim 1 wherein each of the vertical memory cells including a storage capacitor and an access device with a vertical channel defined in the semiconductor body and a gate configured to switch current flow through the vertical channel to the storage capacitor.

* * * * *